US008625278B2

(12) United States Patent
Wang et al.

(10) Patent No.: US 8,625,278 B2
(45) Date of Patent: Jan. 7, 2014

(54) ELECTRONIC DEVICE WITH COOLER

(75) Inventors: Rui Wang, Wuhan (CN); Zhi-Jiang Yao, Wuhan (CN); Li-Fu Xu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 213 days.

(21) Appl. No.: 13/300,735

(22) Filed: Nov. 21, 2011

(65) Prior Publication Data
US 2012/0182690 A1 Jul. 19, 2012

(30) Foreign Application Priority Data

Jan. 13, 2011 (CN) .......................... 2011 1 0006926

(51) Int. Cl.
*H05K 7/20* (2006.01)
(52) U.S. Cl.
USPC ................ 361/697; 361/679.47; 361/679.48; 361/679.54; 361/704; 361/710; 361/695; 361/719; 165/80.3; 165/104.33; 165/121; 165/122
(58) Field of Classification Search
USPC ............... 361/679.46–679.54, 688–712, 715, 361/719–724; 165/80.2, 80.3, 80.4, 165/121–126, 104.33, 185; 454/184; 174/15.1, 15.2, 16.3
See application file for complete search history.

(56) References Cited

U.S. PATENT DOCUMENTS

| 5,880,930 | A  | * | 3/1999  | Wheaton        | 361/690 |
| 6,055,159 | A  | * | 4/2000  | Sun            | 361/704 |
| 6,198,630 | B1 | * | 3/2001  | Cromwell       | 361/704 |
| 6,400,577 | B1 | * | 6/2002  | Goodwin et al. | 361/816 |
| 6,480,387 | B1 | * | 11/2002 | Lee et al.     | 361/704 |
| 6,545,879 | B1 | * | 4/2003  | Goodwin        | 361/807 |
| 6,611,431 | B1 | * | 8/2003  | Lee et al.     | 361/719 |
| 6,646,881 | B1 | * | 11/2003 | Lai et al.     | 361/719 |
| 6,920,052 | B2 | * | 7/2005  | Callahan et al.| 361/767 |
| 6,930,884 | B2 | * | 8/2005  | Cromwell et al.| 361/710 |
| 7,126,823 | B2 | * | 10/2006 | Chen et al.    | 361/702 |
| 7,142,427 | B2 | * | 11/2006 | Reents         | 361/704 |
| 7,262,969 | B2 | * | 8/2007  | Lee et al.     | 361/704 |
| 7,283,368 | B2 | * | 10/2007 | Wung et al.    | 361/719 |
| 7,292,447 | B2 | * | 11/2007 | Xia et al.     | 361/719 |
| 7,576,989 | B2 | * | 8/2009  | Li et al.      | 361/719 |
| 7,641,431 | B2 | * | 1/2010  | Luo et al.     | 411/353 |
| 7,864,526 | B2 | * | 1/2011  | Liu            | 361/695 |

(Continued)

FOREIGN PATENT DOCUMENTS

CN           201518116 U  *  6/2010  ............... G06F 1/20

*Primary Examiner* — Michail V Datskovskiy
(74) *Attorney, Agent, or Firm* — Altis Law Group, Inc.

(57) ABSTRACT

An electronic device comprises a cooler comprises a plurality of first locking members, a backboard defining pluralities of first and second positioning holes, and a circuit board. The backboard is attached to the cooler through the first locking members engaged with the second positioning holes. A first mounting member and a second mounting member are adapted to receive the heat generating component. The first mounting member defines a plurality of locking holes. The first positioning holes are among the second positioning holes. The second mounting member receives the heat generating component, the circuit board is between the second mounting member and the backboard, the first mounting member is secured to the circuit board; when the first mounting member receives the heat generating component, the circuit board is between the first mounting member and the backboard, the first mounting member is secured to the backboard.

13 Claims, 4 Drawing Sheets

(56) References Cited

U.S. PATENT DOCUMENTS

| | | | |
|---|---|---|---|
| 7,870,888 B2* | 1/2011 | Zhou et al. | 165/80.3 |
| 7,924,566 B2* | 4/2011 | Nie et al. | 361/710 |
| 8,004,845 B2* | 8/2011 | Yu et al. | 361/719 |
| 8,144,470 B2* | 3/2012 | Maloney | 361/719 |
| 2007/0217159 A1* | 9/2007 | Long et al. | 361/704 |
| 2008/0002366 A1* | 1/2008 | Tsai et al. | 361/704 |
| 2008/0151507 A1* | 6/2008 | Wu et al. | 361/719 |
| 2008/0285239 A1* | 11/2008 | Yun | 361/720 |
| 2009/0269952 A1* | 10/2009 | Yu et al. | 439/78 |
| 2010/0220447 A1* | 9/2010 | Nie et al. | 361/710 |
| 2010/0232109 A1* | 9/2010 | Liu | 361/697 |

* cited by examiner

ELECTRONIC DEVICE WITH COOLER

BACKGROUND

1. Technical Field

The present disclosure relates to electronic devices, and particularly to an electronic device with a cooler.

2. Description of Related Art

A cooling device is often used to cool a heat generating component, such as a central processing unit (CPU). The heat generating component is often secured to a mounting member. Generally, the cooling device comprises a cooler and a backboard for securing the cooler to a circuit board. Each of the cooling devices made from different manufacturers may each have a different specification and a different mounting method. As a result, each of the cooling devices may has a different backboard corresponding to every different mounting member When the mounting member is to be replaced, the backboard of the cooling device corresponding to the mounting member may also need be replaced. Replacing the backboard may be costly and time consuming. An improved electronic device with a cooling device may be desired.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
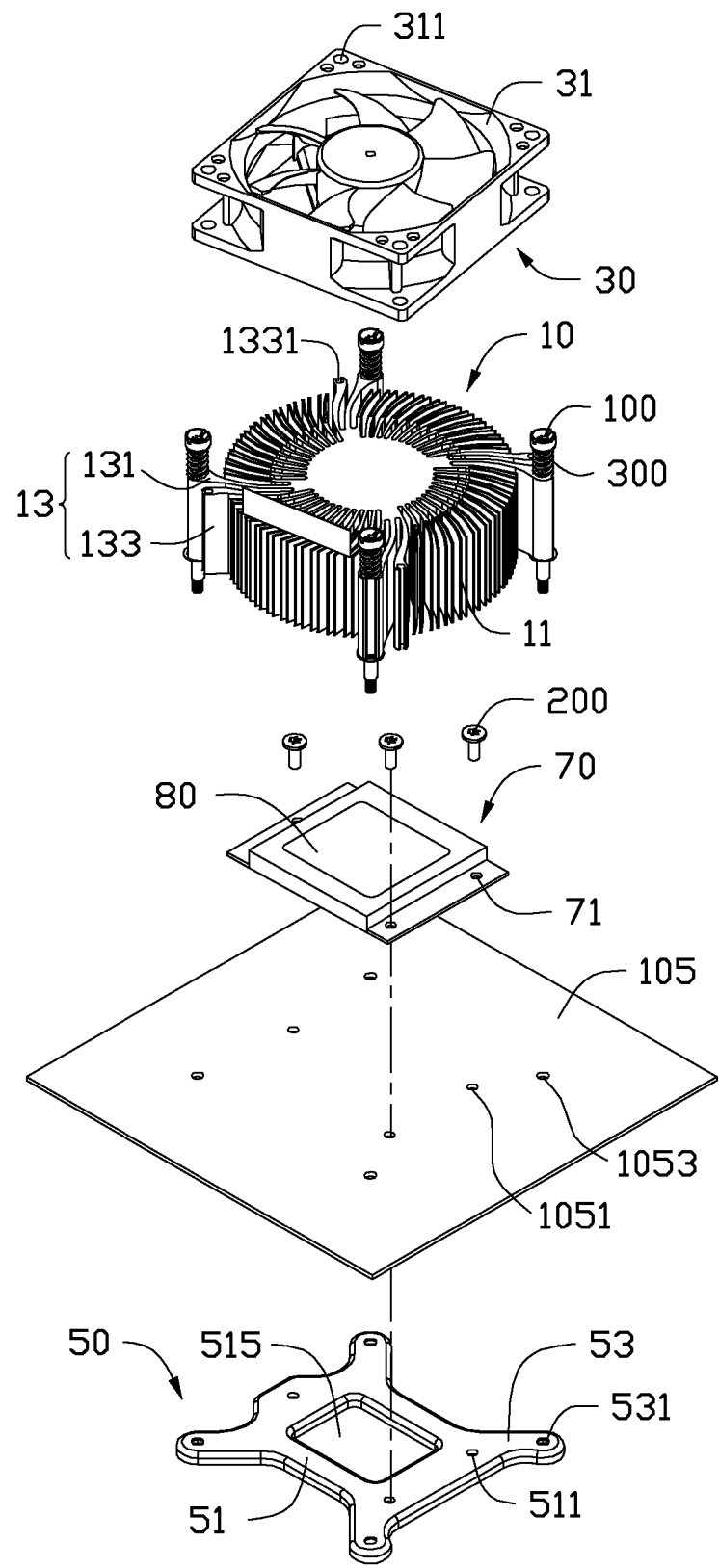
FIG. 1 is an exploded, isometric view of one embodiment of an electronic device with a first mounting member.

Referring to FIG. 1, one embodiment of an electronic device comprises a cooler 10, a fan assembly 30, a backboard 50, and a circuit board 105.

The cooler 10 comprises a plurality of fins 11, and a plurality of mounting portions 13 in the plurality of fins 11. Each of the plurality of mounting portions 13 comprises a first mounting piece 131, and a second mounting piece 133 adjacent to the first mounting piece 131. The first mounting piece 131 and the second mounting piece 133 extend from adjacent two of the plurality of fins 11. The first mounting piece 131 defines a first mounting hole (not shown), and the second mounting piece 133 defines a second mounting hole 1331. A first locking member 100, such as a screw, is inserted into each first mounting hole. A spring 300 is secured between a top end of the first locking member 100 and a top end of the first mounting piece 131. A shape, outlined by the first mounting pieces 131, is substantially a rectangle, and each first mounting piece 131 is at a corner of the rectangle. In one embodiment, the plurality of fins 11 defines a round outline, and the round outline is located in the rectangle.

The fan assembly 30 comprises a case 31, and a fan (not labeled) secured to the case 31. Each corner of the case 31 defines a through hole 311 corresponding to each of the second mounting hole 1331 of the second mounting piece 133.

The backboard 50 comprises a body 51, and a positioning pieces 53 extending from each corner of the body 51. The body 51 defines an opening 515, and a plurality of first positioning holes 511 on two opposite sides of the opening 515. Each of the positioning pieces 53 defines a second positioning hole 531. A distance between adjacent two of the second positioning holes 531 is substantially equal to a distance between adjacent two of the first mounting holes of the first mounting piece 131. A first polygon is outlined by the plurality of first positioning holes 511. A second polygon is outlined by the second positioning holes 531. In one embodiment, the first polygon is located in the second polygon.

The circuit board 105 defines a plurality of first securing holes 1051, and a plurality of second securing holes 1053. Each of the plurality of first securing holes 1051 corresponds to each of the plurality of first positioning holes 511. Each of the plurality of second securing holes 1053 corresponds to each of the second positioning holes 531. In one embodiment, the circuit board 105 is a motherboard.

Figure 2:
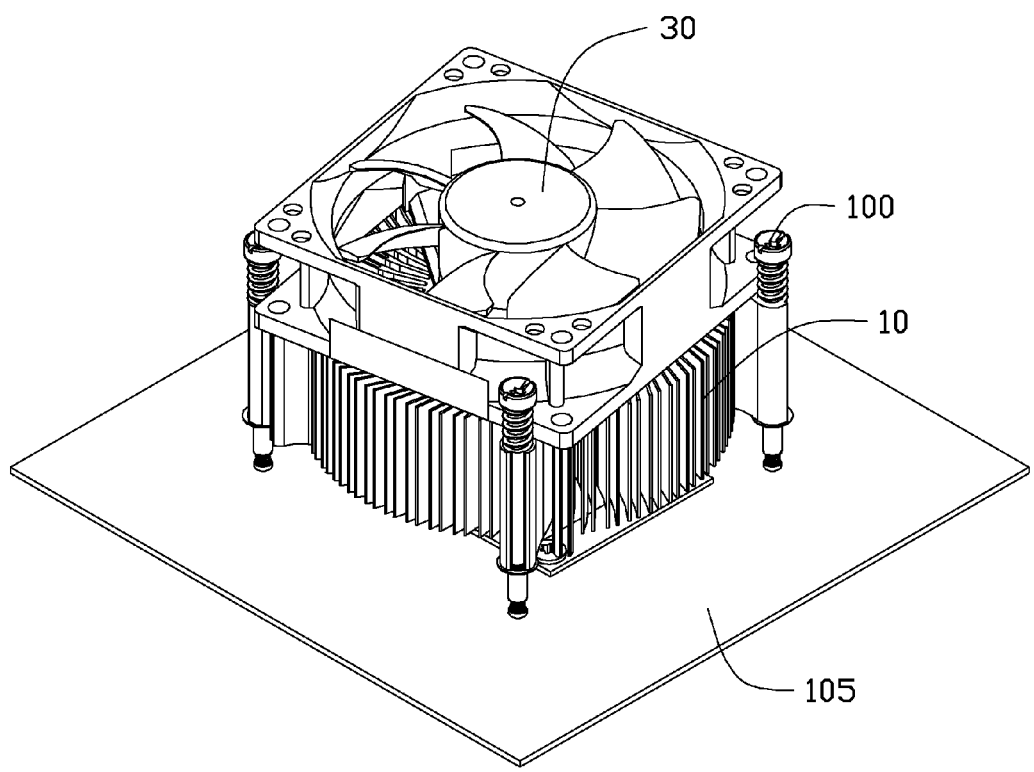
FIG. 2 is an isometric view of the assembled electronic device of FIG. 1.
Figure 3:
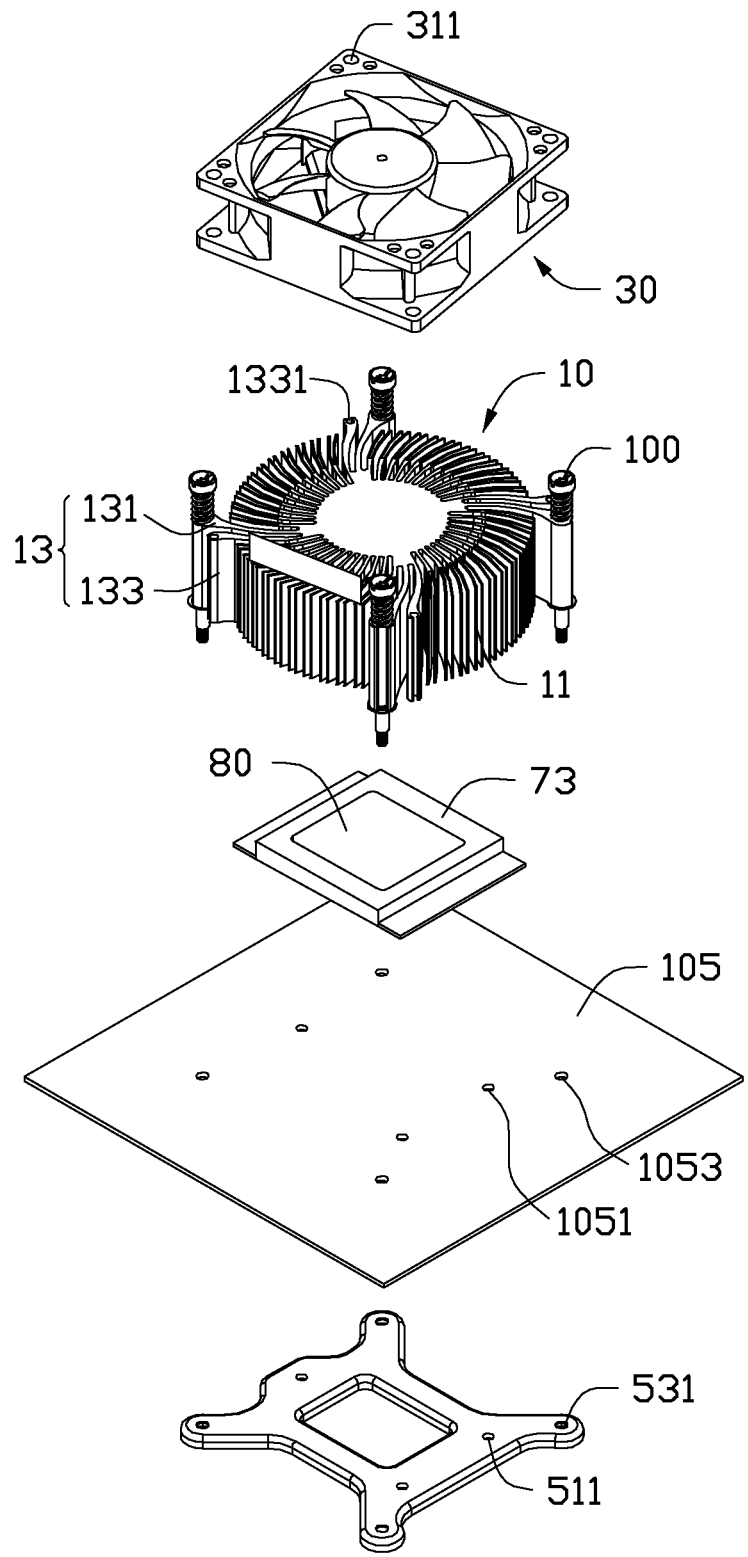
FIG. 3 is an exploded, isometric view of one embodiment of an electronic device with a second mounting member.
Figure 4:
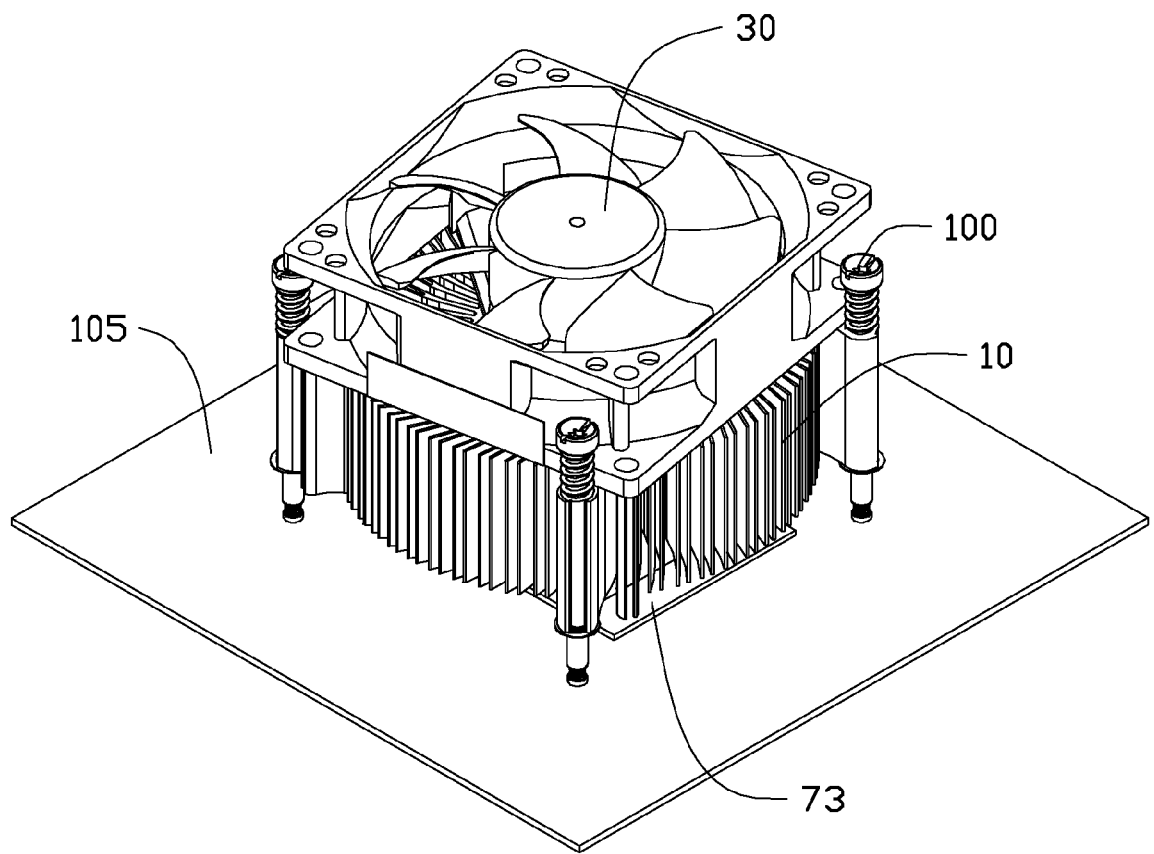
FIG. 4 is an isometric view of the assembled electronic device of FIG. 3.

Referring to FIGS. 2-4, the cooler 10 and the fan assembly 30 may cool a heat generating component 80. The heat generating component 80 may be received in a first mounting member 70 and a second mounting member 73. In one embodiment, the heat generating component 80 is a CPU.

The first mounting member 70 and the second mounting member 73 are adapted to connect the heat generating component 80 to the circuit board 105. The first mounting member 70 defines a plurality of locking holes 71 corresponding to the plurality of first positioning holes 511 of the backboard 50.

In assembly, the fan assembly 30 is placed above the cooler 10. The fan assembly 30 abuts the cooler 10, and the through holes 311 are aligned with the second mounting holes 1331 of the cooler 10. A locking member, such as a screw, is inserted through each of the through holes 311 and the second mounting holes 1331. The fan assembly 30 is secured to the cooler 10.

Referring to FIG. 1 and FIG. 2, wherein the heat generating component 80 is received in the first mounting member 70, the first mounting member 70 abuts a top surface of the circuit board 105, and the plurality of locking holes 71 are aligned with the plurality of first securing holes 1051. The backboard 50 abuts a bottom surface of the circuit board 105. The plurality of first positioning holes 511 are aligned with the plurality of first securing holes 1051, and the second positioning holes 531 are aligned with the plurality of second securing holes 1053. A second locking members 200, such as a screw, is inserted through each of the plurality of locking holes 71, each of the plurality of first securing holes 1051, and each of the plurality of first positioning holes 511. The first mounting member 70 is secured to the backboard 50 through the circuit board 105. The cooler 10 is adjacent to the circuit board 105 and abuts a top surface of the first mounting member 70. One first locking member 100 is aligned with each of the plurality of second securing holes 1053 and each of the second positioning holes 531. Each of the first locking member 100 is rotated into each of the plurality of second securing holes 1053 and each of the second positioning holes 531. The cooler 10 is secured to the backboard 50 through the circuit board 105. The spring 300 is elastically deformed to exert elastic force to engage the first locking member 100 in each of the plurality of second positioning holes 531.

Referring to FIG. 3 and FIG. 4, wherein the heat generating component 80 is received in the second mounting member 73, and the second mounting member 73 is soldered on a top surface of the circuit board 105. The backboard 50 abuts a bottom surface of the circuit board 105. Each second positioning hole 531 is aligned with each of the plurality of second securing holes 1053. The cooler 10 is moved to adjacent to the circuit board 105 and abuts a top surface of the second mounting member 73. One first locking member 100 is aligned with each of the plurality of second securing holes 1053 and each of the second positioning holes 531. The locking member 100 is rotated into each of the plurality of second securing holes 1053 and each of the second positioning holes 531. The cooler 10 is secured to the backboard 50 through the circuit board 105. The spring 300 is elastically deformed to exert elastic force to engage the locking member 100 in each of the plurality of second positioning holes 531.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
   a cooler adapted to cool a heat generating component, the cooler comprises a plurality of first locking members;
   a backboard defining a plurality of first positioning holes and a plurality of second positioning holes, the backboard is attached to the cooler through each of the plurality of first locking members engaged with each of the plurality of second positioning holes;
   a first mounting member adapted to receive the heat generating component, the first mounting member defines a plurality of locking holes; and
   a circuit board;
   wherein the plurality of first positioning holes are positioned among the plurality of second positioning holes; the circuit board is between the first mounting member and the backboard, and the first mounting member is secured to the backboard through the plurality of first positioning holes; the cooler further comprises a plurality of mounting portions, each of the plurality of mounting portions comprises a first mounting piece, and a second mounting piece adjacent to the first mounting piece, and each of the plurality of first locking members is in each of the first mounting pieces.

2. The electronic device of claim 1, wherein a spring is secured between the first mounting piece and each of the plurality of first locking members.

3. The electronic device of claim 1, further comprising a fan assembly, and the fan assembly defines a plurality of through holes; the second mounting piece defines a second mounting hole, and a distance between adjacent two of the plurality of through holes is substantially equal to a distance between adjacent two of the second mounting holes.

4. The electronic device of claim 3, wherein each corner of the fan assembly is located between adjacent two of the first mounting pieces.

5. The electronic device of claim 1, wherein the circuit board defines a plurality of first securing holes corresponding to the plurality of first positioning holes of the backboard; the first mounting member, the circuit board, and the backboard are connected together by a second locking member engaged in each of the plurality of locking holes, the plurality of first securing holes, and the plurality of first positioning holes.

6. The electronic device of claim 1, wherein the circuit board further defines a plurality of second securing holes corresponding to the plurality of second positioning holes of the backboard; the cooler, the circuit board, and the backboard are connected together by each of the plurality of first locking members engaged in each of the plurality of second securing holes, and the plurality of second positioning holes.

7. The electronic device of claim 1, wherein the plurality of first positioning holes outline a first polygon, the plurality of second positioning holes outline a second polygon; the first polygon is located in the second polygon.

8. An electronic device comprising:
   a cooler adapted to cool a heat generating component;
   a backboard defining a plurality of first positioning holes and a plurality of second positioning holes, and the cooler is secured to the backboard through each of the plurality of second positioning holes;
   a second mounting member adapted to receive the heat generating component and being soldered on the circuit board; and
   a circuit board;
   wherein the plurality of first positioning holes outline a first polygon, the plurality of second positioning holes outline a second polygon, and the first polygon is located in the second polygon; the circuit board is between the second mounting member and the backboard; the cooler further comprises a plurality of mounting portions, each of the plurality of mounting portions comprises a first mounting piece and a second mounting piece adjacent to the first mounting piece, and each of the plurality of first locking members is in the first mounting piece.

9. The electronic device of claim 8, wherein a spring is secured between the first mounting piece and each of the plurality of first locking members.

10. The electronic device of claim 8, further comprising a fan assembly, and the fan assembly defines a plurality of through holes; the second mounting piece defines a second mounting hole, and a distance between adjacent two of the plurality of through holes is substantially equal to a distance between adjacent two of the second mounting holes.

11. The electronic device of claim 10, wherein each corner of the fan assembly is located between adjacent tow of the first mounting pieces.

12. The electronic device of claim 8, wherein the backboard defines an opening, the circuit board secures a plurality of electronic components, and the opening is adapted to prevent the plurality of electronic components from blocking by the backboard.

13. The electronic device of claim 8, wherein the circuit board further defines a plurality of second securing holes corresponding to the plurality of second positioning holes of the backboard; the cooler, the circuit board, and the backboard are connected together by each of the plurality of first locking members engaged in each of the plurality of second securing holes, and the plurality of second positioning holes.

* * * * *